(12) United States Patent
Kiyota et al.

(10) Patent No.: US 9,202,787 B2
(45) Date of Patent: Dec. 1, 2015

(54) SUBSTRATE MEMBER AND METHOD OF MANUFACTURING CHIP

(71) Applicant: CANON COMPONENTS, INC, Kodama-gun, Saitama-ken (JP)

(72) Inventors: Hideo Kiyota, Saitama-ken (JP); Keisuke Inoue, Saitama-ken (JP)

(73) Assignee: CANON COMPONENTS, INC. (JP)

( * ) Notice: Subject to any disclaimer, the term of this patent is extended or adjusted under 35 U.S.C. 154(b) by 0 days.

(21) Appl. No.: 14/036,900

(22) Filed: Sep. 25, 2013

(65) Prior Publication Data
US 2014/0084426 A1  Mar. 27, 2014

(30) Foreign Application Priority Data

Sep. 25, 2012  (JP) .................. 2012-211515
Sep. 6, 2013  (JP) .................. 2013-185668

(51) Int. Cl.
  *H01L 23/544* (2006.01)
  *H01L 21/78* (2006.01)
  *H01L 23/00* (2006.01)

(52) U.S. Cl.
  CPC .............. *H01L 23/544* (2013.01); *H01L 21/78* (2013.01); *H01L 23/562* (2013.01); *H01L 2924/0002* (2013.01)

(58) Field of Classification Search
  USPC .......... 257/620, E21.596, E21.599, 685, 686, 257/723, 726, E25.031–E25.032, E23.042, 257/48; 438/68, 113, 114, 458, 460–465; 264/40.1
  See application file for complete search history.

(56) References Cited

U.S. PATENT DOCUMENTS

| | | | |
|---|---|---|---|
| 8,415,232 B2 | 4/2013 | Kajiyama et al. | |
| 8,435,868 B2* | 5/2013 | Shigihara et al. | 438/462 |
| 8,791,574 B2* | 7/2014 | Akiba et al. | 257/773 |
| 2004/0077109 A1* | 4/2004 | Tan et al. | 438/1 |
| 2009/0194868 A1* | 8/2009 | Chong et al. | 257/712 |
| 2010/0078769 A1* | 4/2010 | West et al. | 257/620 |
| 2010/0207251 A1* | 8/2010 | Yu et al. | 257/620 |
| 2011/0156219 A1* | 6/2011 | Kawashima et al. | 257/620 |
| 2012/0018859 A1* | 1/2012 | Tashiro et al. | 257/666 |
| 2014/0175678 A1* | 6/2014 | Kuroda et al. | 257/783 |

FOREIGN PATENT DOCUMENTS

JP  2012-89730 A  5/2012

* cited by examiner

*Primary Examiner* — Dao H Nguyen
*Assistant Examiner* — Tram H Nguyen
(74) *Attorney, Agent, or Firm* — Rossi, Kimms & McDowell LLP (57) ABSTRACT

A substrate member includes a substrate and a plurality of chip regions formed on the substrate across a scribe line. Each of the plurality of chip regions includes a first region that has contact with the scribe line and in which a plurality of first pattern elements are formed, and a second region that is surrounded by the first region and in which a plurality of second pattern elements are formed. A minimum value of a size of the first pattern elements is greater than a minimum value of a size of the second pattern elements and/or a minimum value of an interval between adjacent first pattern elements is greater than a minimum value of an interval between adjacent second pattern elements.

18 Claims, 7 Drawing Sheets

SUBSTRATE MEMBER AND METHOD OF MANUFACTURING CHIP

BACKGROUND OF THE INVENTION

1. Field of the Invention

The present invention relates to a substrate member and a method of manufacturing a chip.

2. Description of the Related Art

A substrate member, in which a plurality of chip regions having circuit patterns are formed on a silicon wafer (substrate) by repeating process of photoresist coating, exposure, development, etching, and so on, is manufactured as a pre-process in semiconductor manufacturing. The substrate member manufactured in pre-process is divided (diced) into individual chips, assembled, and mounted in a post-process to manufacture semiconductors. Chip arrangements for forming the greatest number of rectangular chips possible on a circular substrate, dicing techniques for reducing the width of dicing streets (scribe lines), and so on are being considered as ways to increase a number of chips obtained from a substrate member. Japanese Patent Laid-Open No. 2012-89730 discloses a dicing technique that irradiates a substrate with a laser so that light is condensed on the interior of the substrate in order to reduce the width of dicing streets.

However, when the dicing technique disclosed in Japanese Patent Laid-Open No. 2012-89730 was employed, there was a possibility of melting, whiskers, crystal defects and so on possibly occurring due to heat produced by the laser irradiation in the vicinity of cutting lines in the substrate member. For this reason, short circuit, disconnection, a change in resistance and so on were generated, and thereby areas in the vicinity of cutting lines could be susceptible to breakdowns in the circuit patterns and so on. Thus, there was a problem of not significantly reducing the width of the scribe lines. Further, when dicing using a blade, it was necessary to maintain a width of the blade in the range from 20 to 35 μm. In addition, there was a possibility that damage could be caused by coolant for cooling the blade or by cleaning fluid used to remove shavings. Therefore, there was a problem of not being able to reduce the width of the scribe lines beyond the reduction achieved by laser dicing.

SUMMARY OF THE INVENTION

Upon investigating the effects of dicing on circuit patterns, the inventors of the present invention realized that the width of scribe lines can be reduced by adjusting the circuit patterns at areas of the chip regions in the vicinity of cut lines.

In light of this realization, the present invention provides a substrate member that increases a number of chips obtained from the substrate member and improves the yield of chips.

The present invention in its first aspect provides a substrate member comprising a substrate and a plurality of chip regions formed on the substrate across a scribe line, wherein each of the plurality of chip regions includes a first region that has contact with the scribe line and in which a plurality of first pattern elements are formed, and a second region that is surrounded by the first region and in which a plurality of second pattern elements are formed; and a minimum value of a size of the first pattern elements is greater than a minimum value of a size of the second pattern elements and/or a minimum value of an interval between adjacent first pattern elements is greater than a minimum value of an interval between adjacent second pattern elements.

The present invention in its second aspect provides a substrate member comprising a substrate and a plurality of chip regions formed on the substrate across a scribe line, wherein each of the plurality of chip regions includes a first region that has contact with the scribe line and a second region that surrounds the first region; pattern elements are formed spanning the first region and the second region; and a minimum value of a size of a first portion, that is located in the first region, of each pattern element is greater than a minimum value of a size of a second portion, that is located in the second region, of each pattern element and/or a minimum value of an interval between adjacent first portions is greater than a minimum value of an interval between adjacent second portions.

Further features of the present invention will become apparent from the following description of exemplary embodiments (with reference to the attached drawings).

DESCRIPTION OF THE EMBODIMENTS

Hereinafter, embodiments in which the present invention can be applied will be described based on the drawings.

Figure 1A:
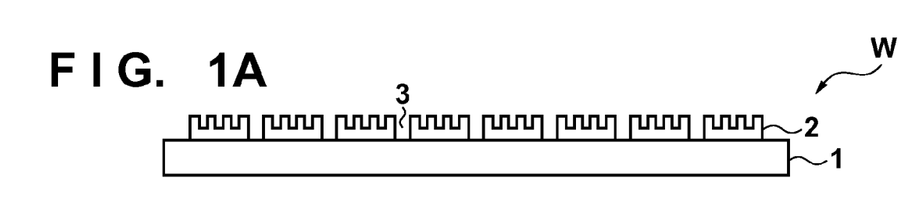
FIGS. 1A to 1C are diagrams illustrating an overview of a substrate member.
Figure 1B:
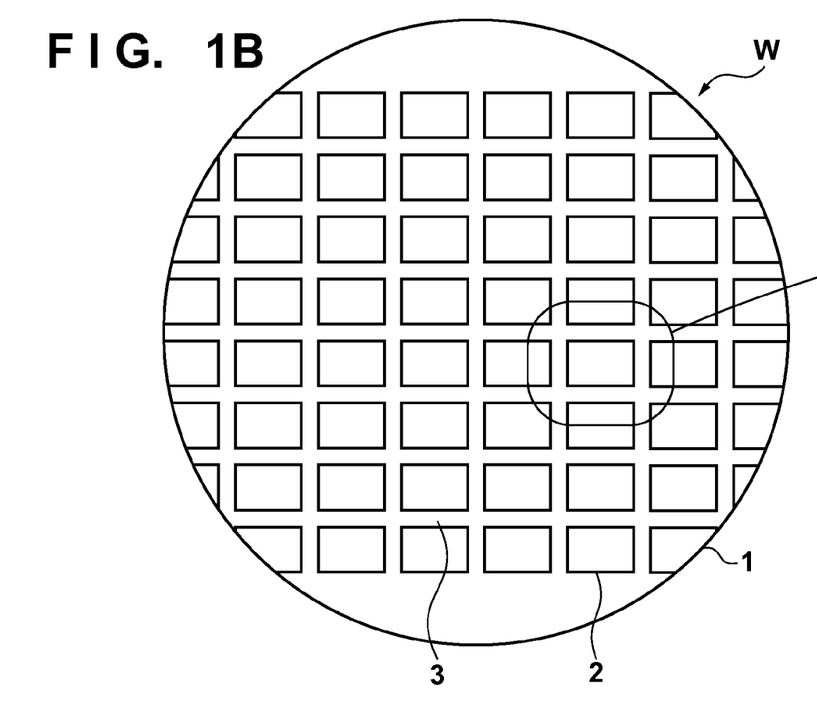
Figure 1C:
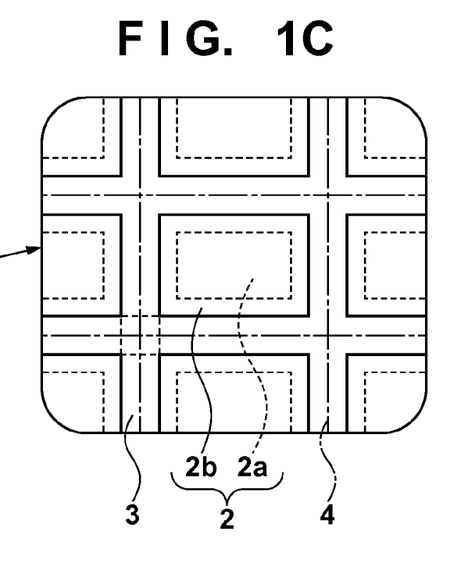

FIGS. 1A and 1B are a cross-sectional view and a plan view, respectively, illustrating an overview of a substrate member W, whereas FIG. 1C is a partial enlargement of the content of FIG. 1B. The substrate member W includes a substrate 1 such as a silicon wafer, and a plurality of rectangular chip regions 2 formed using scribe lines 3 within an effective area on the substrate 1 that excludes the peripheral area thereof. Patterns P such as circuit patterns configured of through-holes, lines and spaces, wiring patterns, and so on are formed in the chip regions 2. For example, with line and space patterns, the pattern P is configured of a plurality of lines, and each line corresponds to a pattern element 5 of which the pattern P is configured.

As shown in FIG. 1C, each chip region 2 has a first region 2b corresponding to a peripheral area that makes contact with the scribe lines 3 and a second region 2a corresponding to a central area surrounded by the first region 2b. A plurality of the patterns P are formed in both the first region 2b and the second region 2a. There are also cases where the patterns P are formed spanning the first region 2b and the second region 2a. Accordingly, the pattern elements 5 are formed on both the first region 2b and the second region 2a. Furthermore, there are cases where the pattern elements 5 are formed spanning the first region 2b and the second region 2a. The pattern elements 5 formed in the first region 2b will be referred to as first pattern elements 5b, whereas the pattern elements 5 formed in the second region 2a will be referred to as second pattern elements 5a. The substrate member W is diced along cut lines 4 located in the center of the scribe lines 3 so as to divide the substrate member W into individual chip regions 2 (a dicing process), and chips are created as a result. The substrate member W is diced by irradiating the cut lines 4 with a laser, cutting along the cut lines 4 using a blade, or the like. The examples described below assume that the dicing is carried out using a laser.

First Embodiment

In the substrate member W according to a first embodiment of the present invention, the plurality of patterns P are present in the first regions 2b and the second regions 2a, but patterns P that span the first regions 2b and the second regions 2a are not present. That is, the first pattern elements 5b formed in the first regions 2b and the second pattern elements 5a formed in the second regions 2a do not belong to the same patterns. In the first embodiment, at least one of the following relationships holds true: one, a minimum size of the plurality of second pattern elements 5a is greater than a minimum size of the plurality of first pattern elements 5b, and two, a minimum interval between two mutually-adjacent second pattern elements 5a is greater than a minimum interval between two mutually-adjacent first pattern elements 5b. Examples of the substrate member W according to the first embodiment will be described below with reference to FIGS. 2 to 6.

First Example

Figure 2:
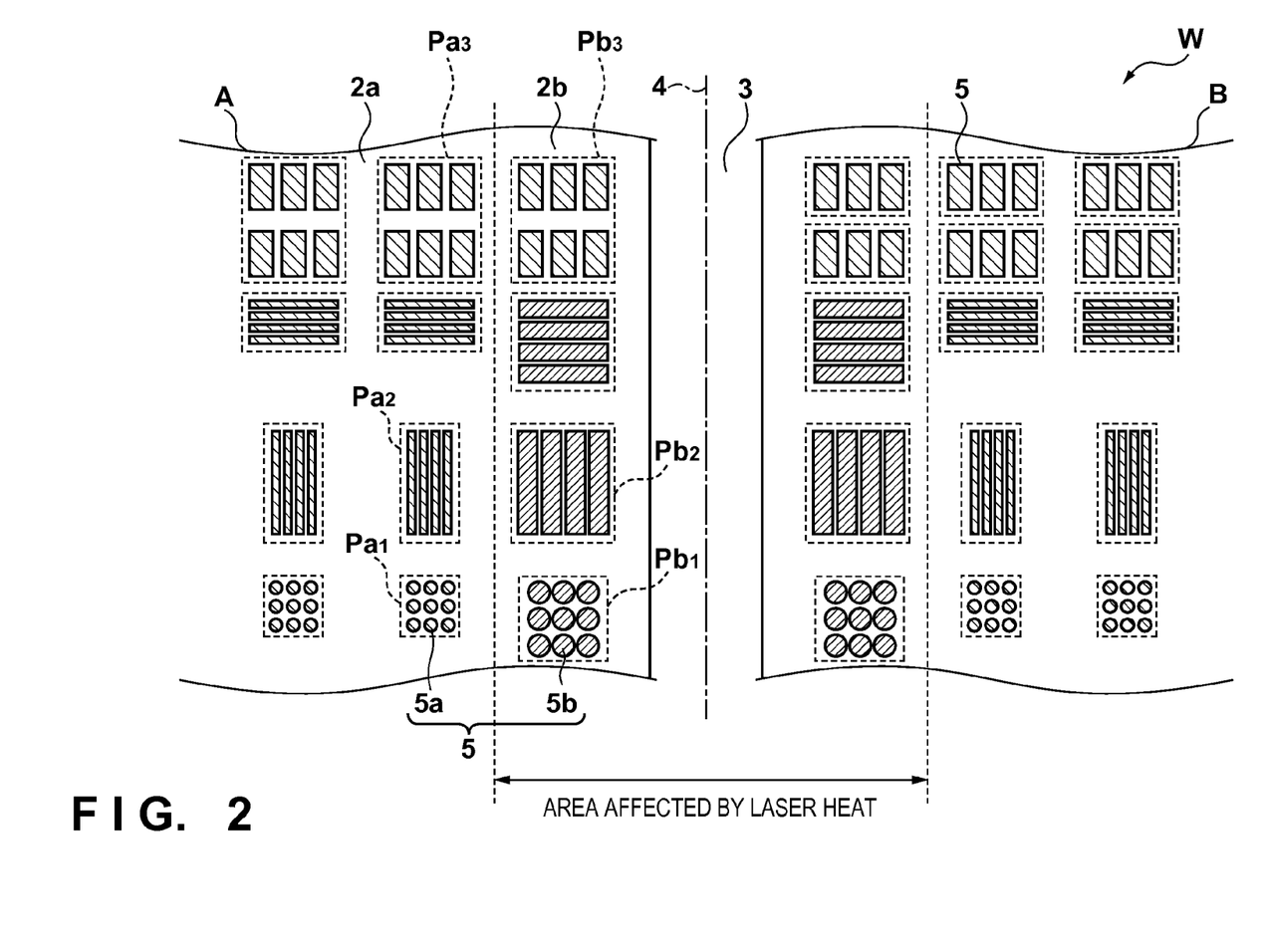
FIG. 2 is a partial enlarged plan view of a substrate member according to a first example.

As shown in FIG. 2, in the substrate member W according to the first example, regions of a predetermined width on both sides of the cut line 4 provided in the center of the scribe line 3 that separates two chip regions A and B are susceptible to the effects of heat produced by the laser used in the dicing. Of the chip regions A and B, parts that make contact with the scribe line 3 and that are highly susceptible to the effects of heat produced by the laser are taken as the first regions 2b, whereas the central areas that are less susceptible to the effects of heat produced by the laser are taken as the second regions 2a. Conventionally, the pattern elements 5 have not been formed in the first regions 2b of the substrate member W due to those regions being highly susceptible to the effects of heat produced by the laser. However, in the first example, the plurality of patterns P are formed in both the first regions 2b and the second regions 2a.

Through-hole pattern elements (first pattern elements) 5b in first patterns Pb1 formed in the first regions 2b will now be compared to through-hole pattern elements (second pattern elements) 5a in second patterns Pa1 that are formed in the second regions 2a and correspond to the first patterns Pb1. The diameters of the first pattern elements 5b are greater than the diameters of the second pattern elements 5a. The region for the scribe line 3 is substantially reduced by setting the diameters (sizes) of the first pattern elements 5b to widths that make it difficult for situations such as breakage of the pattern P (pattern element 5) to occur due to heat produced by the laser.

Looking at first patterns Pb2 and second patterns Pa2 located above the first patterns Pb1 and the second patterns Pa1 in FIG. 2, it can be seen that the first patterns Pb2 and the second patterns Pa2 are line and space patterns. In other words, the first pattern elements 5b and second pattern elements 5a that configure the first patterns Pb2 and the second patterns Pa2, respectively, have long, rectangular shapes. If the first pattern elements 5b are formed in the first regions 2b at the same widths as the second pattern elements 5a, the first regions 2b will be susceptible to the effects of heat produced by the laser used for dicing. Accordingly, the widths of the first pattern elements 5b are set to be greater than the widths of the second pattern elements 5a in the first patterns Pb2 and the second patterns Pa2, which makes it difficult for situations such as breakage of the pattern P (pattern element 5) to occur due to heat produced by the laser.

The first patterns Pb3 in the first regions 2b and the second patterns Pa3 in the second regions 2a, which are formed in the uppermost regions in FIG. 2, have the same functions from each other and have a relationship in positions and so on, are configured of six rectangular pattern elements 5 arrayed two-dimensionally. However, the widths of the first pattern elements 5b that configure the first patterns Pb3 are the same as the widths of the second pattern elements 5a that configure the second patterns Pa3. As a result, the second pattern elements 5a have widths that make it difficult for situations such as wire breakage to occur due to heat produced by the laser, and thus the first pattern elements 5b can be made less susceptible to the effects of heat produced by the laser used for the dicing even if the first pattern elements 5b are formed in the first regions 2b at the same widths as the second pattern elements 5a.

Second Example

Figure 3:
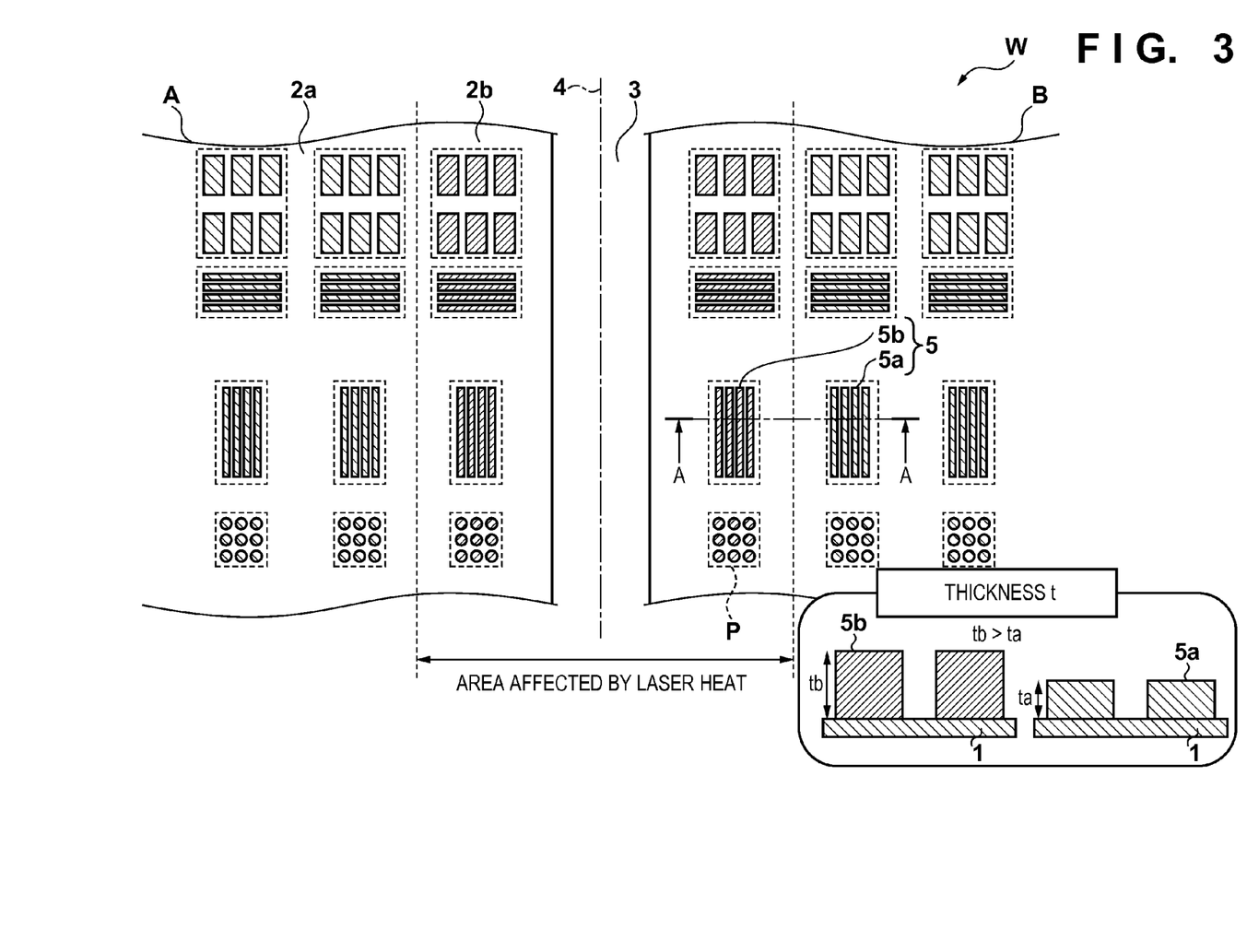
FIG. 3 is a partial enlarged plan view and a cross-sectional view of a substrate member according to a second example.

In the first example, the sizes of the first pattern elements 5b in a plane parallel to the surface of the substrate 1, or in other words, the widths and diameters, are set to be greater than those of the second pattern elements 5a. In a second example, the sizes of the first pattern elements 5b in a direction perpendicular to the surface of the substrate 1, or in other words, the heights of the pattern elements 5, are set to be greater than the heights of the second pattern elements 5a. As shown in FIG. 3, in the second example, when a thickness of a pattern layer that configures the first pattern elements 5b is taken as $t_b$ and a thickness of a pattern layer that configures the second pattern elements 5a is taken as $t_a$, $t_b > t_a$.

Third Example

Figure 4:
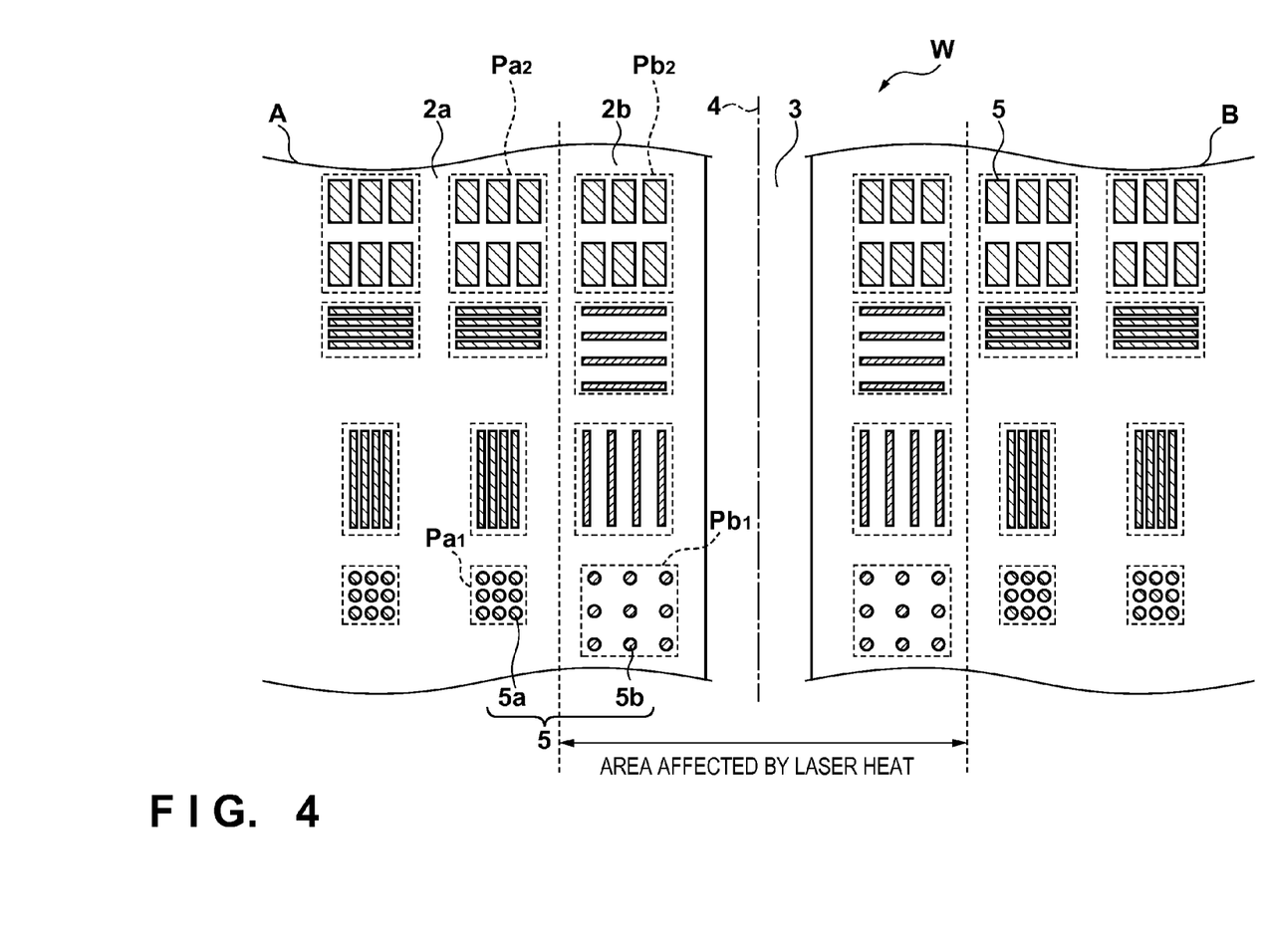
FIG. 4 is a partial enlarged plan view of a substrate member according to a third example.
Figure 5:
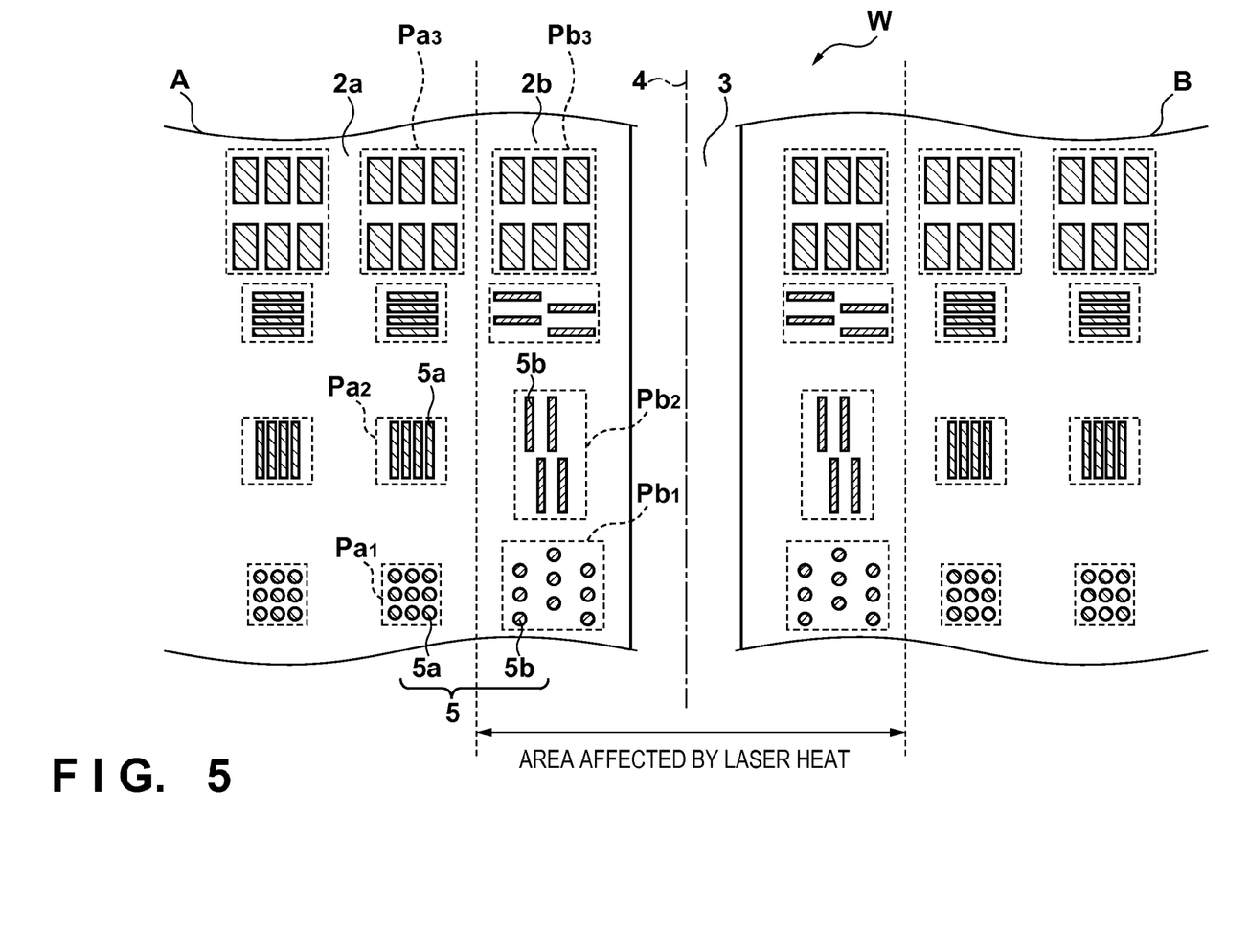
FIG. 5 is a partial enlarged plan view of a substrate member according to a fourth example.

As shown in FIG. 4, in the substrate member W according to a third example, intervals between adjacent rectangular pattern elements that configure line and space patterns formed in the first regions 2b, intervals between adjacent through-hole pattern elements, and so on are set to be greater than corresponding intervals formed in the second regions 2a. Although the first pattern elements 5b formed in the first regions 2b are highly susceptible to the effects of heat produced by the laser, the interval between the first pattern elements 5b is set to be large, which makes it difficult for situations such as breakage of the pattern P (pattern element 5) to occur.

Fourth Example

The intervals between adjacent pattern elements differ between the plurality of first pattern elements 5b and the plurality of second pattern elements 5a in the third example; however, the elements are arrayed in identical forms. In the fourth example, however, the plurality of first pattern elements 5b that configure the first patterns Pb2 and the plurality of second pattern elements 5a that configure the second patterns Pa2 are arrayed in different forms so as to vary the intervals between adjacent pattern elements. In the substrate member W shown in FIG. 5, the plurality of second pattern elements 5a are arrayed along one direction and the plurality of first pattern elements 5b are arrayed in a staggered arrangement, which makes it difficult for situations such as breakage of the pattern P (pattern element 5) to occur.

Fifth Example

Figure 6:
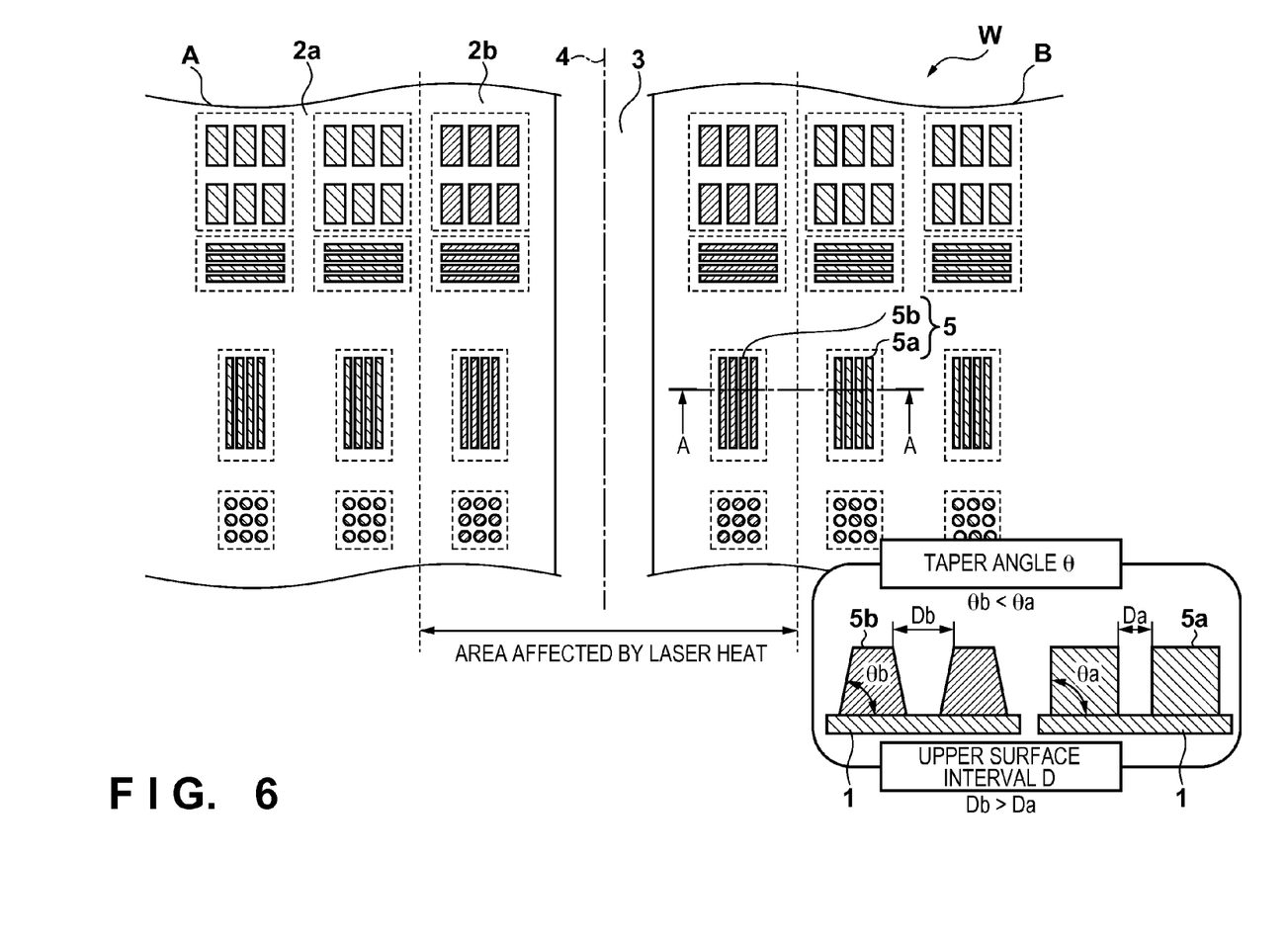
FIG. 6 is a partial enlarged plan view and a cross-sectional view of a substrate member according to a fifth example.

In the second example, the first pattern elements 5b and the second pattern elements 5a are formed so that the side surfaces thereof are perpendicular to the surface of the substrate 1. Accordingly, in the second example, the intervals between the top surfaces of adjacent pattern elements 5 are essentially the same as the intervals between the base portions of those adjacent pattern elements 5. In the fifth example, the second pattern elements 5a are formed so that the side surfaces thereof are perpendicular to the surface of the substrate 1, in the same manner as in the second example. However, the first pattern elements 5b are formed in a shape that tapers toward the leading ends thereof, as shown in FIG. 6. If taper angles of the side surfaces of the first pattern elements 5b and the second pattern elements 5a in the fifth example are taken as θb and θa respectively, the relationship θb<θa is fulfilled. Furthermore, if the intervals between the upper surfaces of the first pattern elements 5b and between the upper surfaces of the second pattern elements 5a in the fifth example are taken as Db and Da respectively, the relationship Db>Da is fulfilled. In other words, although the first pattern elements 5b are more susceptible to the effects of heat produced by the laser than the second pattern elements 5a, the intervals between the upper surfaces of the first pattern elements 5b are greater, which makes it difficult for situations such as breakage of the pattern P (pattern element 5) to occur.

Second Embodiment

Figure 7:
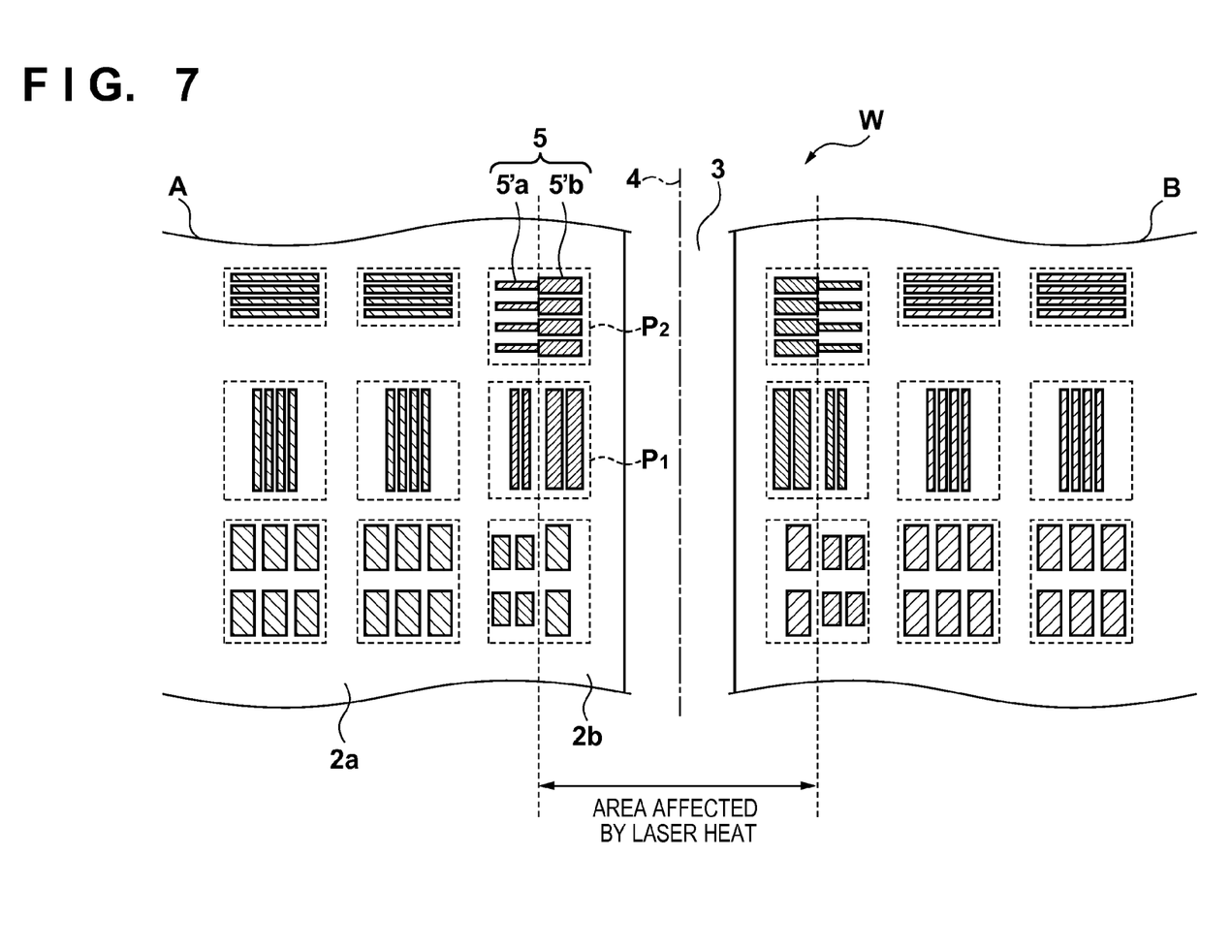
FIG. 7 is a partial enlarged plan view of a substrate member according to a second embodiment.

In the first embodiment, the plurality of patterns P are formed in the first regions 2b or the second regions 2a, but patterns P that span both the first regions 2b and the second regions 2a are not present. As opposed to this, in the second embodiment, patterns P that span both the first regions 2b and the second regions 2a are present. A line and space pattern P1 shown in FIG. 7 is formed spanning both the first region 2b and the second region 2a. Of the four rectangular pattern elements 5 that configure the pattern P1, two of the pattern elements (the first pattern elements 5b) are formed in the first region 2b, and the other two pattern elements (the second pattern elements 5a) are formed in the second region 2a. As indicated in the middle area of FIG. 7, the width of the first pattern elements 5b is set to be greater than the width of the first pattern elements 5b so as to reduce the effects of heat produced by the laser used in the dicing.

Like the pattern P1, the pattern P2 shown in the upper section of FIG. 7 is formed spanning both the first region 2b and the second region 2a. Although the pattern P1 is formed so that the pattern elements 5 therein do not span both the first region 2b and the second region 2a, the pattern P2 is formed so that the pattern elements 5 therein do span both the first region 2b and the second region 2a. Of a single pattern element 5, the width of a first portion 5'b located in the first region 2b is greater than the width of a second portion 5'a located in the second region 2a. As a result, the effects of heat on the first portion 5'b, which is highly susceptible to the effects of heat produced by the laser used in the dicing, can be reduced. In the second embodiment, in the case where a single pattern element 5 spans both the first region 2b and the second region 2a, the width of the portion located in the first region 2b is set to be greater than the width of the portion located in the second region 2a. However, the effects of heat produced by the laser used in the dicing may be reduced by setting the height, the intervals between adjacent portions, and so on of the portions located in the first region 2b to be greater than those of the portions located in the second region 2a, rather than the width.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. Furthermore, the present invention can be implemented by applying at least one of the aforementioned examples, and respective examples may be applied in combination with each other as well.

This application claims the benefit of Japanese Patent Application No. 2012-211515 filed Sep. 25, 2012 and No. 2013-185668 filed Sep. 6, 2013, which are hereby incorporated by reference herein in their entirety.

What is claimed is:

1. A substrate member comprising:
a substrate, and
a plurality of chip regions formed on the substrate across scribe lines, the chip regions being divided at the scribe lines to provide a plurality of chips,
wherein each of the plurality of chip regions includes a first region that has contact with the scribe line and in which a plurality of first pattern elements constituting parts of the plurality of chips are formed, and a second region that is surrounded by the first region and in which a plurality of second pattern elements constituting other parts of the plurality of chips are formed, the first pattern elements and the second pattern elements having the same function as each other; and
wherein a minimum value of a size of the first pattern elements is greater than a minimum value of a size of the second pattern elements and/or a minimum value of an interval between adjacent first pattern elements is greater than a minimum value of an interval between adjacent second pattern elements.

2. The substrate member according to claim 1, wherein the first pattern and the second pattern have a correspondence relationship.

3. The substrate member according to claim 1, wherein the plurality of first pattern elements and the plurality of second pattern elements constitute the same pattern.

4. The substrate member according to claim 1, wherein the size includes a width or a diameter.

5. The substrate member according to claim 1, wherein the size includes a height.

6. The substrate member according to claim 1, wherein the interval is an interval between top surfaces of adjacent pattern elements.

7. A substrate member comprising:
a substrate, and
a plurality of chip regions formed on the substrate across scribe lines, the chip regions being divided at the scribe lines to provide a plurality of chips,
wherein each of the plurality of chip regions includes a first region that has contact with the scribe line and in which a plurality of first pattern elements constituting parts of the plurality of chips are formed, and a second region that is surrounded by the first region and in which a plurality of second pattern elements constituting other parts of the plurality of chips are formed, and a minimum value of a size of the first pattern elements is greater than a minimum value of a size of the second pattern elements and/or a minimum value of an interval between adjacent first pattern elements is greater than a minimum value of an interval between adjacent second pattern elements,
wherein the interval is an interval between top surfaces of adjacent pattern elements,
wherein a minimum value of the interval between the top surfaces of adjacent first pattern elements is set to be greater than a minimum value of the interval between the top surfaces of adjacent second pattern elements by forming width of the plurality of first pattern elements in a tapered shape.

8. The substrate member according to claim 1, wherein a minimum value of the interval between adjacent first pattern elements is set to be greater than a minimum value of the interval between adjacent second pattern elements by arraying the plurality of first pattern elements differently than the plurality of second pattern elements.

9. The substrate member according to claim 8, wherein the plurality of second pattern elements are arrayed along one direction and the plurality of first pattern elements are arrayed in a staggered arrangement.

10. A substrate member comprising a substrate and a plurality of chip regions formed on the substrate across scribe lines, the chip regions being divided at the scribe lines to provide a plurality of chips, wherein each of the plurality of chip regions includes a first region that has contact with the scribe line and a second region that surrounds the first region;
pattern elements constituting part of the chips are formed spanning the first region and the second region; and
a minimum value of a size of a first portion, that is located in the first region, of each pattern element is greater than a minimum value of a size of a second portion, that is located in the second region, of each pattern element and/or a minimum value of an interval between adjacent first portions is greater than a minimum value of an interval between adjacent second portions.

11. The substrate member according to claim 10, wherein the size includes a width or a diameter.

12. The substrate member according to claim 10, wherein the size includes a height.

13. The substrate member according to claim 10, wherein the interval is an interval between top surfaces of adjacent pattern elements.

14. A substrate member comprising a substrate and a plurality of chip regions formed on the substrate across scribe lines, the chip regions being divided at the scribe lines to provide a plurality of chips, wherein each of the plurality of chip regions includes a first region that has contact with the scribe line and a second region that surrounds the first region;
pattern elements constituting part of the plurality of chips are formed spanning the first region and the second region; and
a minimum value of a size of a first portion, that is located in the first region, of each pattern element is greater than a minimum value of a size of a second portion, that is located in the second region, of each pattern element and/or a minimum value of an interval between adjacent first portions is greater than a minimum value of an interval between adjacent second portions, wherein the interval is an interval between top surfaces of adjacent pattern elements,
wherein a minimum value of the interval between the top surfaces of adjacent first portions is set to be greater than a minimum value of the interval between the top surfaces of adjacent second portions by forming width of the plurality of first portions in a tapered shape.

15. A method of manufacturing a chip, the method comprising:
a dicing process of dividing a substrate member into individual a plurality of chips, wherein the substrate member comprises:
a substrate, and
a plurality of chip regions formed on the substrate across scribe lines, the chip regions being divided at the scribe lines to provide the plurality of chips,
wherein each of the plurality of chip regions includes a first region that has contact with the scribe line and in which a plurality of first pattern elements constituting part of the plurality of chips are formed, and a second region that is surrounded by the first region and in which a plurality of second pattern elements constituting other parts of the plurality of chips are formed, the first pattern elements and the second pattern elements having the same function as each other; and
wherein a minimum value of a size of the first pattern elements is greater than a minimum value of a size of the second pattern elements and/or a minimum value of an interval between adjacent first pattern elements is greater than a minimum value of an interval between adjacent second pattern elements.

16. The method according to claim 15, wherein the dicing process includes dividing the substrate member by irradiating the scribe line with a laser.

17. A method of manufacturing a chip, the method comprising:
a dicing process of dividing a substrate member into individual chips, wherein the substrate member comprises:
a substrate,
a plurality of chip regions formed on the substrate across scribe lines, the chip regions being divided at the scribe lines to provide the plurality of chips, wherein each of the plurality of chip regions includes a first region that has contact with the scribe line and a second region that surrounds the first region; and
pattern elements, constituting part of the plurality of chips, which span the first region and the second region;
wherein a minimum value of a size of a first portion, that is located in the first region, of each pattern element is greater than a minimum value of a size of a second portion, that is located in the second region, of each pattern element and/or a minimum value of an interval between adjacent first portions is greater than a minimum value of an interval between adjacent second portions.

18. The method according to claim 17, wherein the dicing process includes dividing the substrate member by irradiating the scribe line with a laser.

* * * * *

UNITED STATES PATENT AND TRADEMARK OFFICE
CERTIFICATE OF CORRECTION

PATENT NO. : 9,202,787 B2  
APPLICATION NO. : 14/036900  
DATED : December 1, 2015  
INVENTOR(S) : Hideo Kiyota et al.

Page 1 of 1

It is certified that error appears in the above-identified patent and that said Letters Patent is hereby corrected as shown below:

In the claims

In the Claim 15, at column 8, lines 8/9, "...a dicing process of dividing a substrate member into individual a plurality of chips,..." should read as --...a dicing process of dividing a substrate member into a plurality of chips,...--.

Signed and Sealed this
Twelfth Day of April, 2016

Michelle K. Lee
*Director of the United States Patent and Trademark Office*